(12) United States Patent
Jin et al.

(10) Patent No.: US 11,915,956 B2
(45) Date of Patent: Feb. 27, 2024

(54) VERTICAL FEEDING AND WAFER INSERTING INTEGRATED MACHINE

(71) Applicant: TIANJIN HUANBO SCIENCE AND TECHNOLOGY CO., LTD, Tianjin (CN)

(72) Inventors: Lihui Jin, Tianjin (CN); Hua Yang, Tianjin (CN); Mingqiang Geng, Tianjin (CN); Xiaoguang Zhao, Tianjin (CN); Chenpeng Du, Tianjin (CN); Qing Yin, Tianjin (CN)

(73) Assignee: TIANJIN HUANBO SCIENCE AND TECHNOLOGY CO., LTD, Tianjin (CN)

( * ) Notice: Subject to any disclaimer, the term of this patent is extended or adjusted under 35 U.S.C. 154(b) by 0 days.

(21) Appl. No.: 17/919,281

(22) PCT Filed: Jan. 19, 2021

(86) PCT No.: PCT/CN2021/072612
§ 371 (c)(1),
(2) Date: Jan. 7, 2023

(87) PCT Pub. No.: WO2021/208550
PCT Pub. Date: Oct. 21, 2021

(65) Prior Publication Data
US 2023/0274961 A1    Aug. 31, 2023

(30) Foreign Application Priority Data

Apr. 17, 2020   (CN) .......................... 202010306282.3
Apr. 17, 2020   (CN) .......................... 202020578013.8

(51) Int. Cl.
*H01L 21/67*    (2006.01)
*H01L 21/677*   (2006.01)

(52) U.S. Cl.
CPC .... *H01L 21/67712* (2013.01); *H01L 21/6773* (2013.01); *H01L 21/67781* (2013.01)

(58) Field of Classification Search
CPC ...................... H01L 21/67712; H01L 21/6773
See application file for complete search history.

(56) References Cited

FOREIGN PATENT DOCUMENTS

| CN | 107051966 A | 8/2017 |
| CN | 108109935 A | 6/2018 |

(Continued)

OTHER PUBLICATIONS

International Search Report for PCT/CN2021/072612 dated Apr. 22, 2021, ISA/CN.

*Primary Examiner* — Ronald P Jarrett
(74) *Attorney, Agent, or Firm* — Yue (Robert) Xu; Apex Attorneys at Law, LLP

(57) ABSTRACT

The present invention provides a vertical feeding and wafer inserting integrated machine, comprising a rack and a silicon wafer transfer device provided on the rack; a carrying-transporting water tank for carrying and transporting silicon wafers is provided on one end of the rack; the rack is further provided with a feeding unit for conveying the silicon wafers in the carrying-transporting water tank to a silicon wafer transfer belt a wafer inserting unit for inserting the silicon wafers into wafer baskets is provided on one end, away from the feeding unit, of the silicon wafer transfer device, and a wafer basket arraying mechanism is provided on the other end of the wafer inserting unit; and a washing manipulator for transferring grouped wafer baskets to a washing procedure is further correspondingly provided on the rack.

8 Claims, 15 Drawing Sheets

(56) References Cited

FOREIGN PATENT DOCUMENTS

| CN | 110391149 A | 10/2019 |
| CN | 110707032 A | 1/2020 |
| CN | 111430505 A | 7/2020 |
| CN | 212257432 U | 12/2020 |

US 11,915,956 B2

VERTICAL FEEDING AND WAFER INSERTING INTEGRATED MACHINE

The present application is a national phase application of PCT international patent application PCT/CN2021/072612, filed on Jan. 19, 2021 which claims the benefit of priorities to the following two Chinese patent applications, both of which are incorporated herein by reference;
1) Chinese Patent Application No. 202010306282.3, titled "VERTICAL FEEDING AND WAFER INSERTING INTEGRATED MACHINE", filed with the China National Intellectual Property Administration on Apr. 17, 2020, and
2) Chinese Patent Application No. 202020578013.8, titled "VERTICAL FEEDING AND WAFER INSERTING INTEGRATED MACHINE", filed with the China National Intellectual Property Administration on Apr. 17, 2020.

FIELD

The present disclosure relates to the technical field of photovoltaic silicon wafer manufacturing, and in particular to a vertical feeding and wafer inserting integrated machine.

BACKGROUND

With the depletion of conventional fossil energy, people paid more attention to renewable energy research, and the solar energy has the advantages of large reserves, safety and cleanness and has become one of the main energy sources in the future. With the help of rapid industrial development, favorable policies, technological progress and other factors, the photovoltaic power generation industry of China has a rapid growth momentum and maintains a high-speed growth.

During manufacturing of photovoltaic silicon wafers, silicon wafer washing is a key link during the entire manufacturing of the silicon wafer and plays a significant role. Silicon wafer inserting is also an important process to improve the efficiency of silicon wafer washing. The conventional wafer inserting method is a horizontal wafer-separation method, and the present disclosure has a vertical wafer-separation method, which can effectively reduce the wafer breaking rate.

SUMMARY

In view of this, a vertical feeding and wafer inserting integrated machine is provided according to the present disclosure in order to overcome the disadvantages in the conventional technology.

In order to achieve the above object, the technical solution of the present disclosure is provided as follows:
a vertical feeding and wafer inserting integrated machine, includes a frame body and a silicon wafer conveying device which is arranged on the frame body;
one end of the frame body is provided with a carrying-transferring water tank for carrying and transferring silicon wafers; the frame body is further provided with a feeding unit for conveying the silicon wafers in the carrying-transferring water tank to a silicon wafer conveying belt; one end, away from the feeding unit, of the silicon wafer conveying device is provided with a wafer inserting unit for inserting the silicon wafers into a wafer basket, and the other end of the wafer inserting unit is provided with a wafer basket arraying mechanism; and
the frame body is correspondingly provided with a washing manipulator for transferring grouped wafer baskets to a washing procedure.

Furthermore, the carrying-transferring water tank includes a water tank body, a silicon wafer clip and a clip bracket;
the water tank body has a groove structure with an opening at a top, and drainage blocks are provided on two sides of the water tank body for draining water into the groove body; the clip bracket for placing the silicon wafer clip is provided between the two drainage blocks; and the silicon wafer clip is configured to carry the silicon wafers.

Furthermore, the frame body is further provided with a lifting fork for conveying the carrying-transferring water tank to the feeding unit; the lifting fork includes a main framework and parallel guiding rails vertically arranged on one side of the main framework; a sliding table is correspondingly provided on each parallel guiding rail, a rectangular fork perpendicular to the parallel guiding rail is provided on the sliding table; and a top of the main framework is provided with a driving assembly for driving the sliding tables to move;
a centering mechanism for aligning with the lifting fork is provided on a bottom plate of the water tank body; the centering mechanism includes positioning blocks and guiding plates; each guiding plate is fixed at two ends of a bottom of the water tank body, each positioning block is arranged between the two guiding plates; a side, facing outward, of the guiding plate is provided with a plurality of guide wheels; and the middle of the positioning block is provided with a circular positioning hole for positioning a device of a degumming machine;
a centering base corresponding to the centering mechanism is provided on the rectangular fork; and the frame body is further provided with a feeding manipulator for taking out the silicon wafer clip and placing the silicon wafer clip on the feeding unit.

Furthermore, the feeding unit includes a primary feeding mechanism, and a secondary feeding mechanism; the primary feeding mechanism is arranged below a water surface and is adjacent to a silicon wafer outlet of the silicon wafer clip; the primary feeding mechanism is vertically arranged and is located in a tangential direction of a wheel-shaped structure, an upper end of the primary feeding mechanism is adjacent to the secondary feeding mechanism; the primary feeding mechanism is configured to hold the silicon wafers in the silicon wafer clip and upload the silicon wafers to the secondary feeding mechanism; the secondary feeding mechanism has a wheel-shaped structure and is in transmission connection with the frame body, an upper portion of the secondary feeding mechanism is located above the water surface; and the secondary feeding mechanism is configured to turn over the silicon wafers from a vertical state to a horizontal state for feeding the silicon wafer in the conveying device;
a wafer pressing mechanism is provided on a plane along a radial direction of the wheel-shaped structure of the secondary feeding mechanism and perpendicular to the primary feeding mechanism; and a gap is provided between the wafer pressing mechanism and the secondary feeding mechanism;

the wafer pressing mechanism has a cylindrical structure with a rotation shaft hole at an axis, and a mounting shaft is correspondingly provided in the rotation shaft hole and rotatably connected to the frame body.

Furthermore, the primary feeding mechanism includes a mounting plate and a water suction plate;

the mounting plate has a rectangular structure, which is vertically arranged and fixedly connected to the frame body; and the water suction plate is fixed to a side, close to an end, of an upper portion of the rectangular structure;

an accommodating space is provided in an interior of the water suction plate, and multiple water suction holes are provided on a side, close to the silicon wafers, of an exterior of the water suction plate; a water outlet is provided on a side, away from the mounting plate, of the water suction plate, the water outlet is in communication with a water suction pump through a pipeline; and the water suction holes and the water outlet are in communication with the accommodating space in the interior of the water suction plate;

a surface, fixed to the water suction plate, of the mounting plate is further provided with multiple mounting holes, a rotation shaft is correspondingly provided in each mounting hole; the rotation shaft is rotatably connected with the corresponding mounting hole, and two ends of the rotation shaft are rotatably connected with the frame body; multiple rolling wheels are fixedly provided in each rotation shaft, the rolling wheels are fixedly connected to the corresponding rotation shaft; and ends of one or more rotation shafts are correspondingly provided with a driving motor for driving the rotation shafts to rotate.

Furthermore, a side spray wafer-separation mechanism for blowing the stacked silicon wafers at intervals is further provided between the silicon wafer clip and the primary feeding mechanism; and the side spray wafer-separation mechanism includes a mounting bottom plate and multiple side spray nozzles;

a main body of the mounting bottom plate is rounded rectangular, an upper side and a lower side of the middle are extended outward to form fixing plates, and each fixing plate is provided with a screw hole for fixation;

an interior of the mounting bottom plate is hollow, a side, close to the water tank, of the mounting bottom plate is provided with multiple mounting holes for mounting the side spray nozzles, the mounting holes are extended through to an internal space of the mounting bottom plate; a side of the mounting bottom plate is provided with a water inlet which extends through to the internal space; and the water inlet is configured to connect an external water inlet pipeline with a water pump.

Furthermore, the feeding unit further includes an in-place detection assembly; the in-place detection assembly includes an approaching sensor, a rotation arm, a mounting rod and a mounting block, one end of the mounting rod penetrates through a lower portion of the mounting block, the other end of the mounting rod is mounted on the frame body, the end, close to the mounting block, of the mounting rod is rotatably connected to the rotation arm, and the approaching sensor is fixed on the mounting block and is arranged toward a direction of the rotation arm.

Furthermore, the wafer inserting unit includes a wafer inserting assembly and a handling assembly;

the wafer inserting assembly includes a vertical lifting device, and a wafer basket; a sliding block of the vertical lifting device is provided with a clamp corresponding to the wafer basket, and the wafer basket is detachably connected to the clamp; multiple wafer-placing grooves are provided inside the wafer basket; a silicon wafer inlet is provided in one side of the wafer basket, and another side, away from the silicon wafer inlet, of the wafer basket is provided with a buffer mechanism;

the buffer mechanism includes a rotation cylinder, a buffer bar and a swing rod, a lever of the rotation cylinder is connected to the swing rod, the buffer bar is mounted on the swing rod, and the buffer bar is placed in the wafer basket by the rotation of the rotation cylinder;

the handling assembly includes a triaxial manipulator and a clamp; the triaxial manipulator is mounted on the frame body and is located above the silicon wafer conveying belt; the clamp is configured to clamp the wafer basket and is fixedly connected to the triaxial manipulator; and the handling assembly is configured to handle and transfer the wafer basket.

Furthermore, a waste discharge assembly is provided on the silicon wafer conveying belt; the waste discharge assembly includes a jacking wafer discharge machine and a visual detector;

the visual detector is configured to detect the silicon wafers on the conveying belt;

the silicon wafer conveying device includes multiple conveying shafts which are rotatably connected to the frame body, and the frame body is correspondingly provided with a driving motor and a conveying belt in order to drive the conveying shafts to move;

the jacking wafer discharge machine is mounted under the silicon wafer conveying device and between two conveying shafts; the jacking wafer discharge machine includes a wafer discharge machine bracket; a bottom of the wafer discharge machine bracket is provided with a cylinder for driving the jacking wafer discharge machine to move upward, a top of the wafer discharge machine bracket is provided with multiple conveying wheels; and the conveying wheels are correspondingly provided with a driving device for driving the conveying wheels to move;

a conveying direction of the conveying wheels is perpendicular to a conveying direction of the silicon wafer conveying device; an abnormal wafer storage box is provided outside the silicon wafer conveying device and along the conveying direction of the conveying wheels.

Furthermore, the wafer basket arraying mechanism includes a feeding sink, an underwater conveying device and a basket turnover assembly;

the feeding sink is mounted on the frame body, the underwater conveying device is mounted at an internal bottom of the feeding sink; the basket turnover assembly turnovers the full wafer basket to be on the underwater conveying device so as to convey the full wafer basket to the next procedure;

the basket turnover assembly includes a turnover back plate, a turnover motor and a turnover bottom plate, the turnover back plate is fixed on the turnover bottom plate, and the turnover motor is fixedly connected to the turnover bottom plate.

Compared with the conventionally technology, the present disclosure has the following advantages:

a wafer breaking rate is effectively reduced by using the vertical wafer-separation method, and the clip feeding machine, the vertical wafer inserting machine, and the basket feeding machine are integrated into one, which effectively reduces control costs and material costs and reduces the floor space.

BRIEF DESCRIPTION OF THE DRAWINGS

The drawings constituting a part of the present application are used to provide a further understanding of the present disclosure, and the exemplary embodiments and descriptions of the present disclosure are used to explain the technical solutions of the present disclosure, and do not constitute an improper limitation to the present disclosure. In the drawings:

FIG. 4 is a cross-sectional view taken along line A-A in FIG. 3a;

FIG. 5 is a cross-sectional view taken along line B-B in FIG. 3a;

REFERENCE NUMERALS IN THE DRAWINGS

Figure 1:
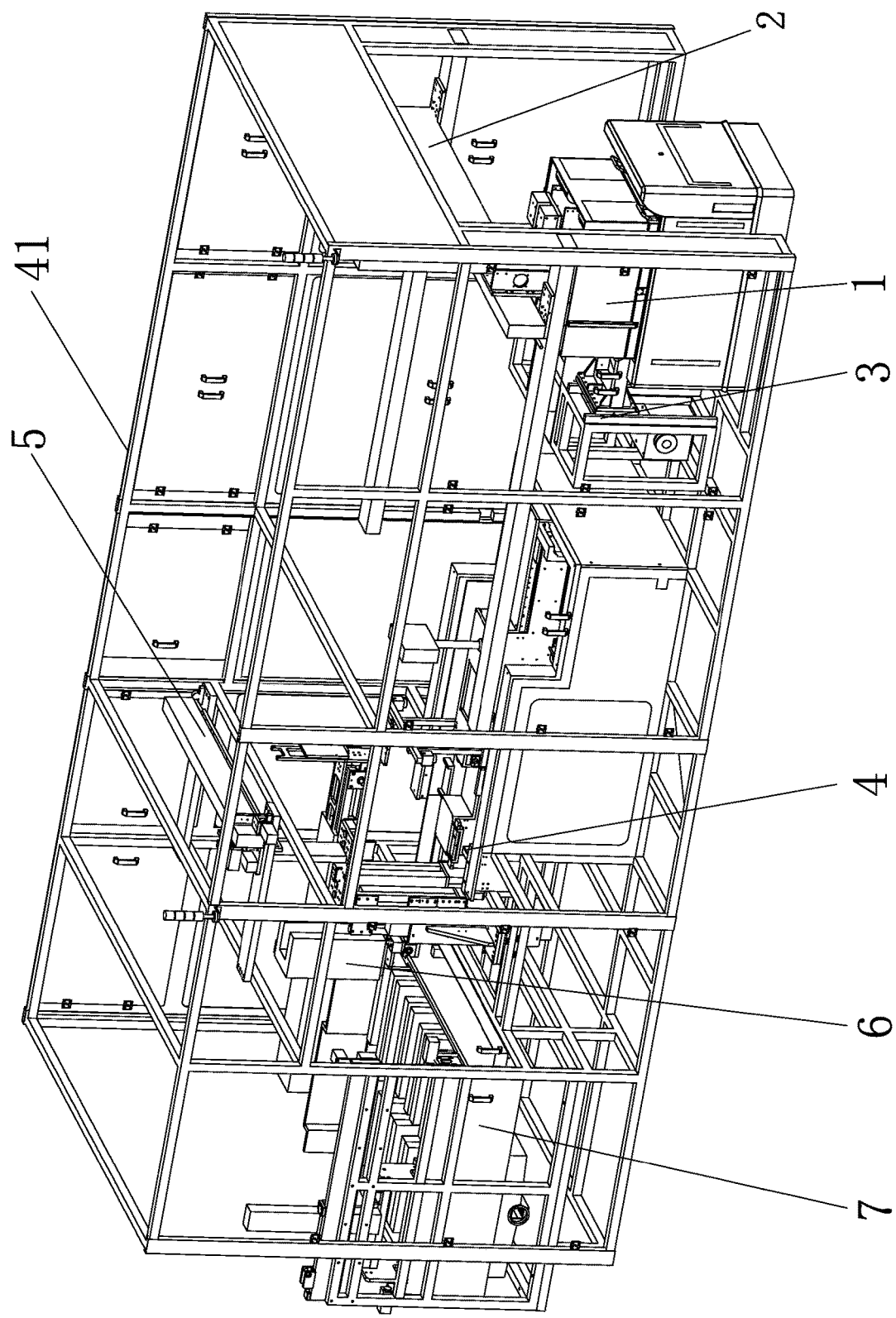
FIG. 1 is a schematic view of a vertical feeding and wafer inserting integrated machine according to an embodiment of the present disclosure.
Figure 2:
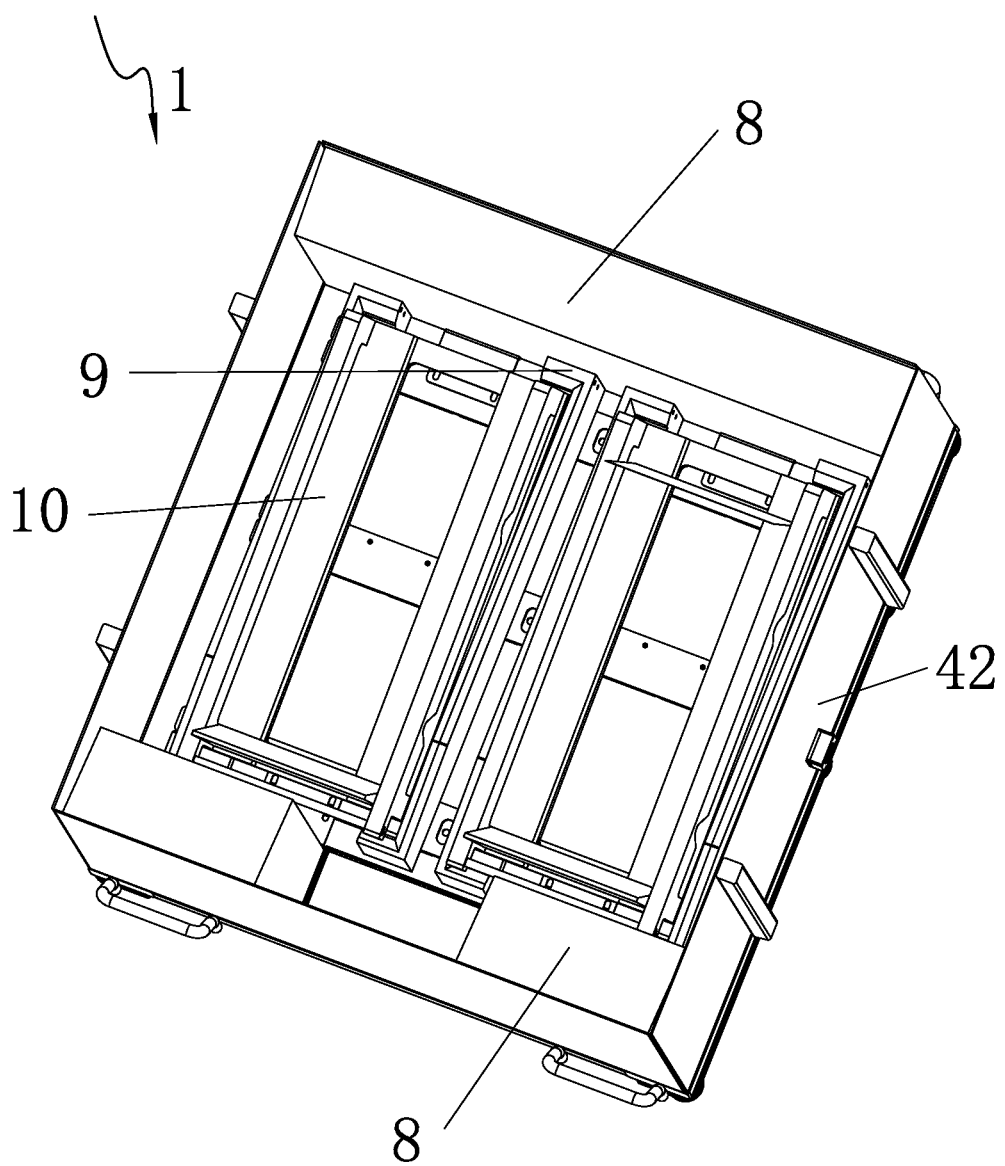
FIG. 2 is a schematic front perspective view of a carrying-transferring water tank according to an embodiment of the present disclosure.
Figure 3:
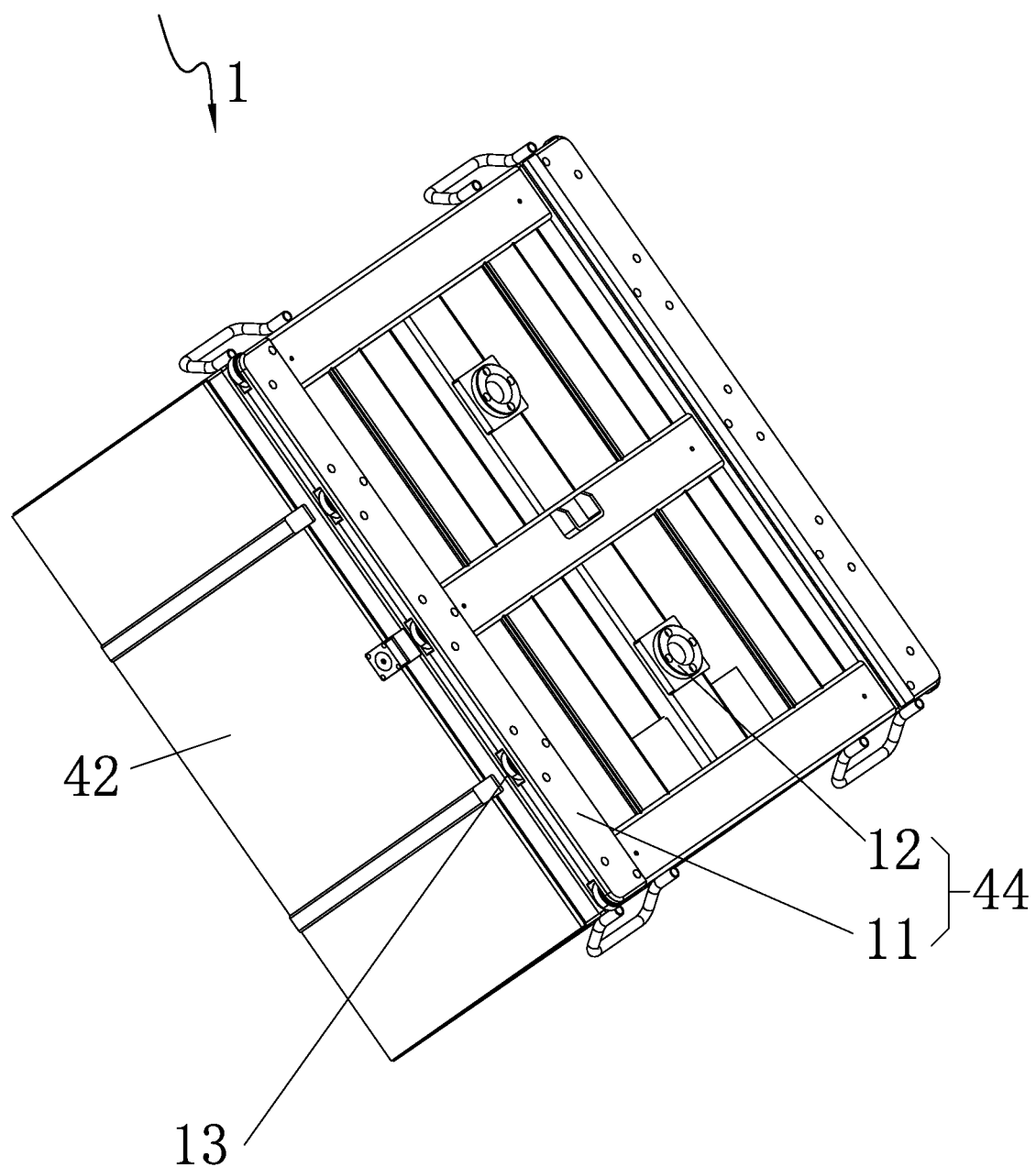
FIG. 3 is a schematic back perspective view of the carrying-transferring water tank according to the embodiment of the present disclosure.
Figure 3A:
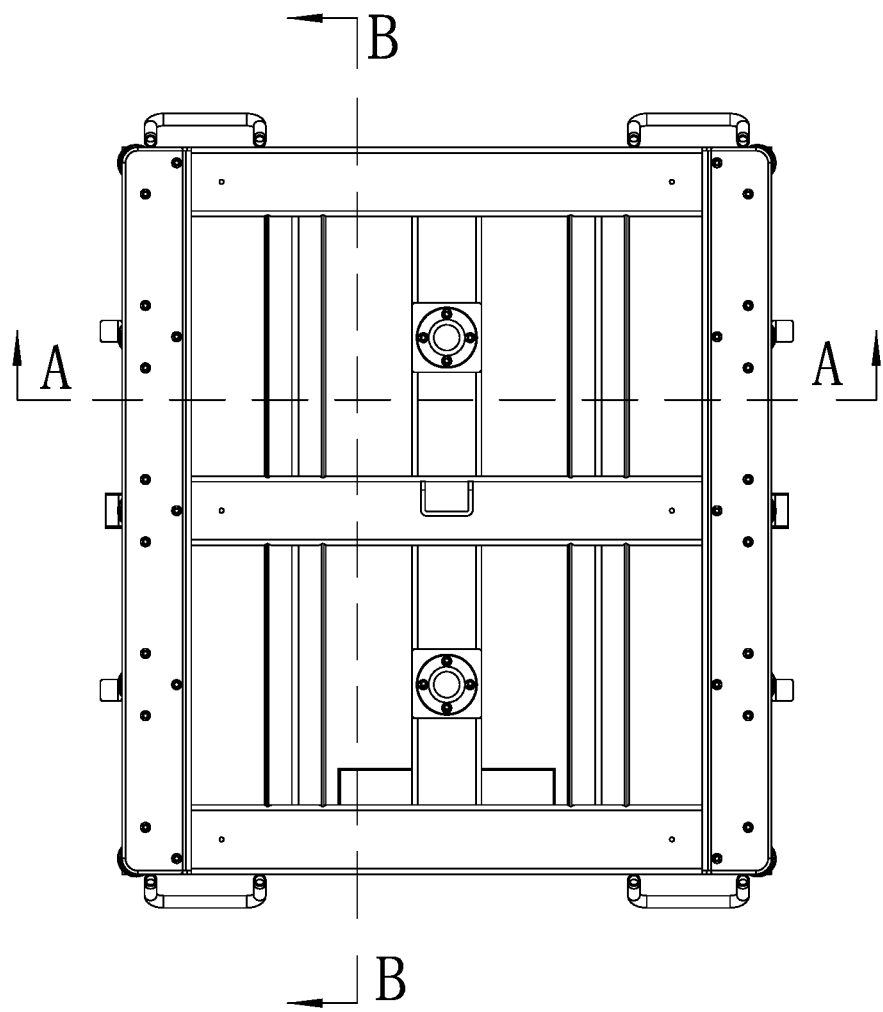
FIG. 3a is a bottom view of the carrying-transferring water tank in FIG. 3.
Figure 4:
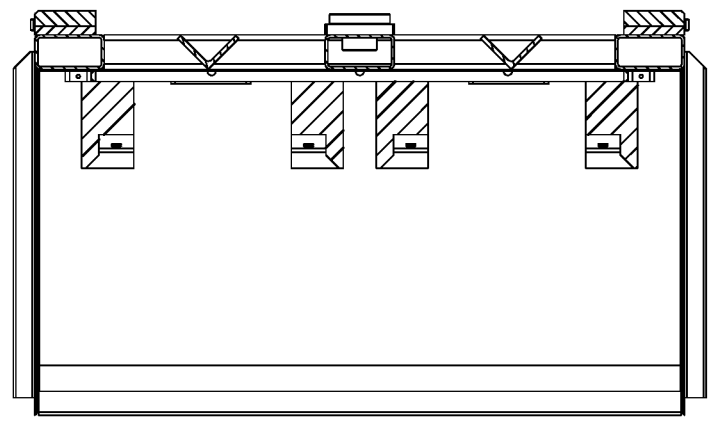
Figure 5:
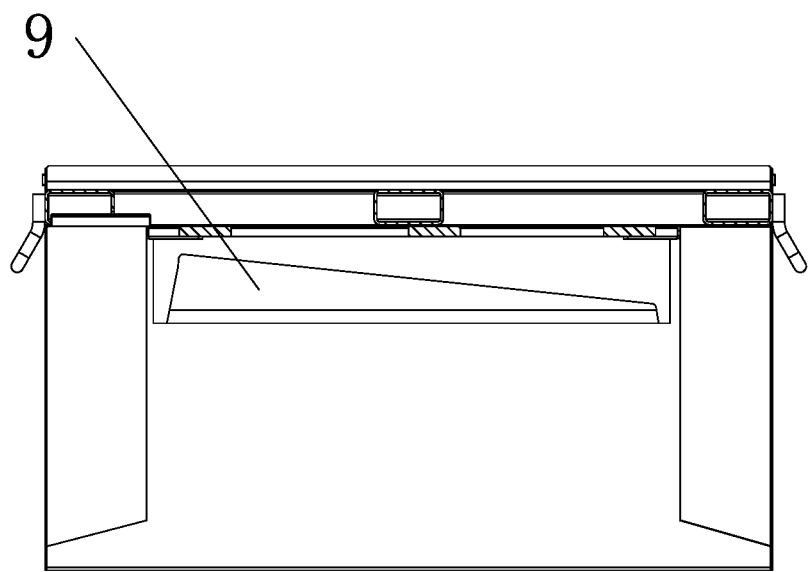
Figure 6:
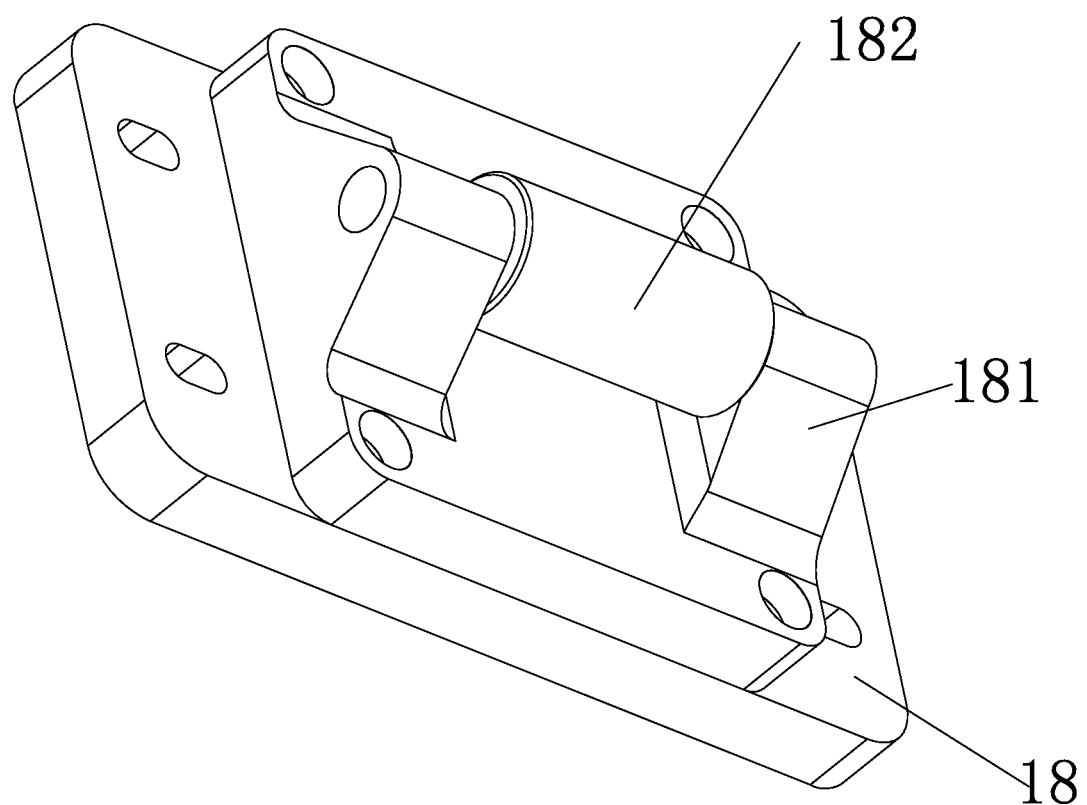
FIG. 6 is a schematic view of a guiding assembly according to an embodiment of the present disclosure.
Figure 7:
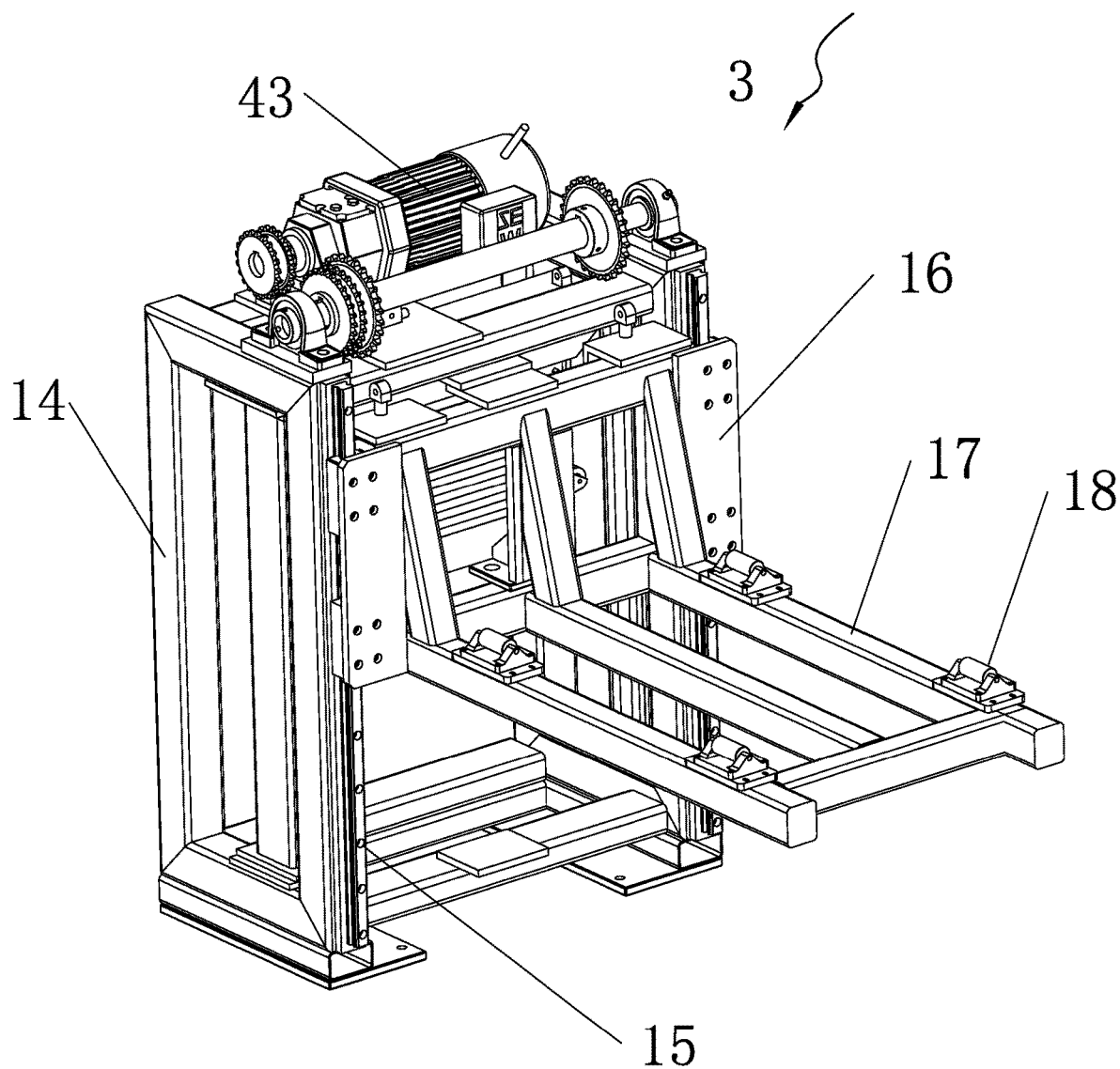
FIG. 7 is a schematic view of a lifting fork according to an embodiment of the present disclosure.
Figure 8:
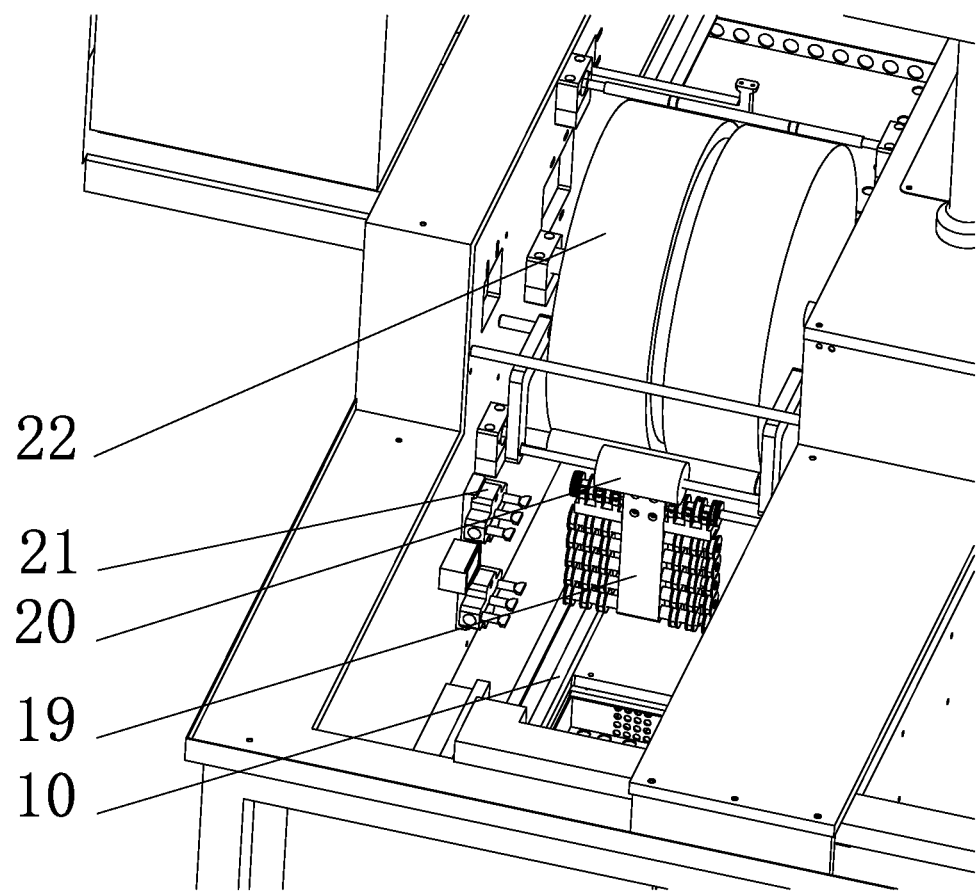
FIG. 8 is a schematic view of a feeding unit according to an embodiment of the present disclosure.
Figure 9:
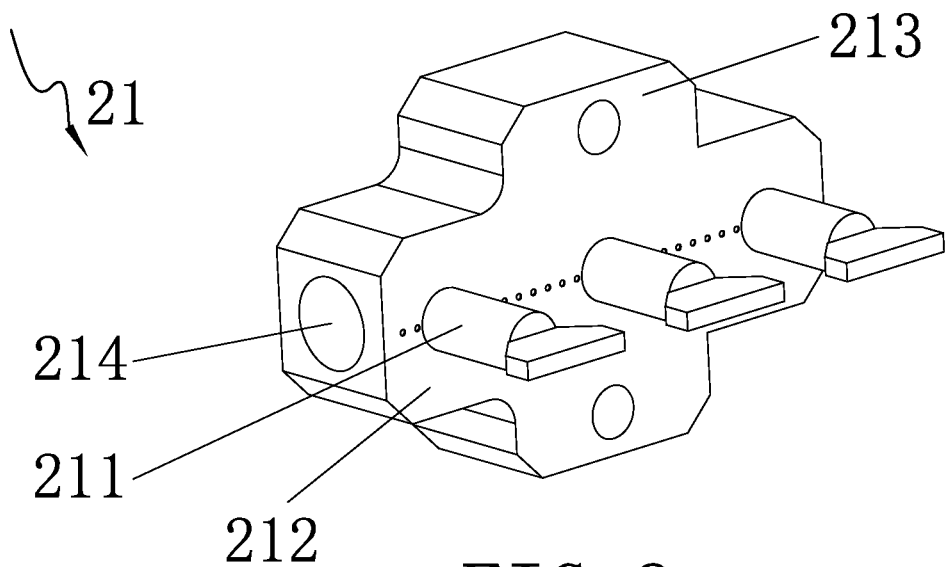
FIG. 9 is a schematic view of a side spray wafer-separation mechanism according to an embodiment of the present disclosure.
Figure 10:
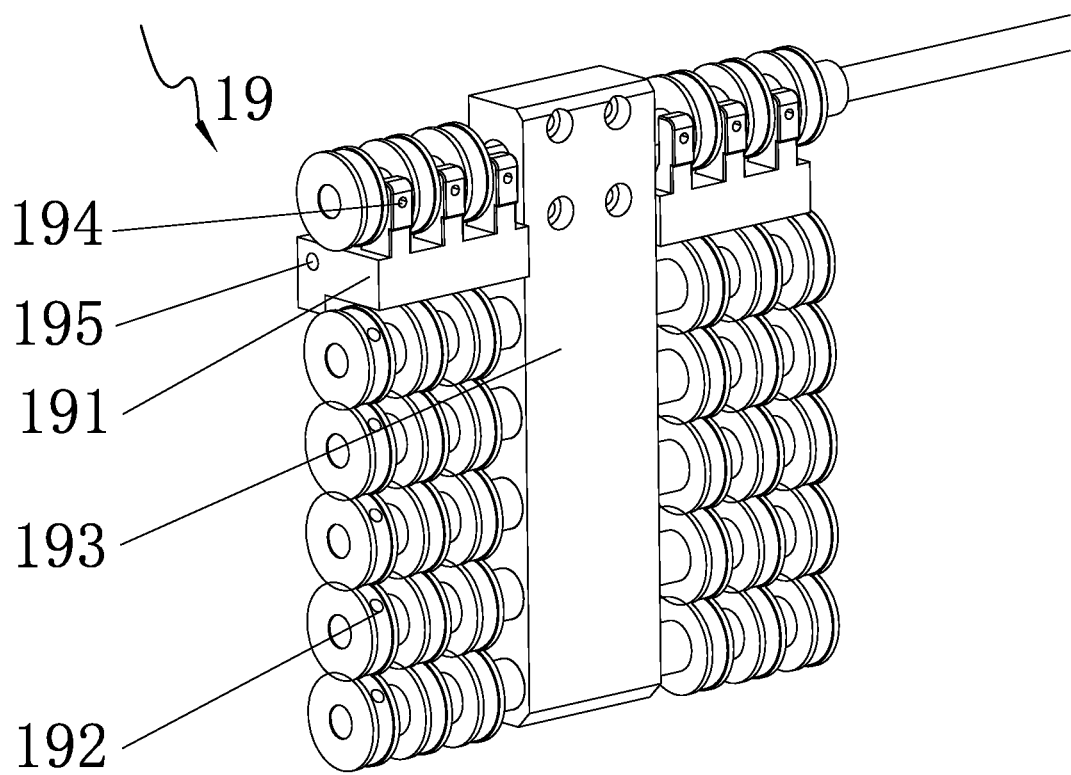
FIG. 10 is a schematic view of a primary feeding mechanism according to an embodiment of the present disclosure.
Figure 11:
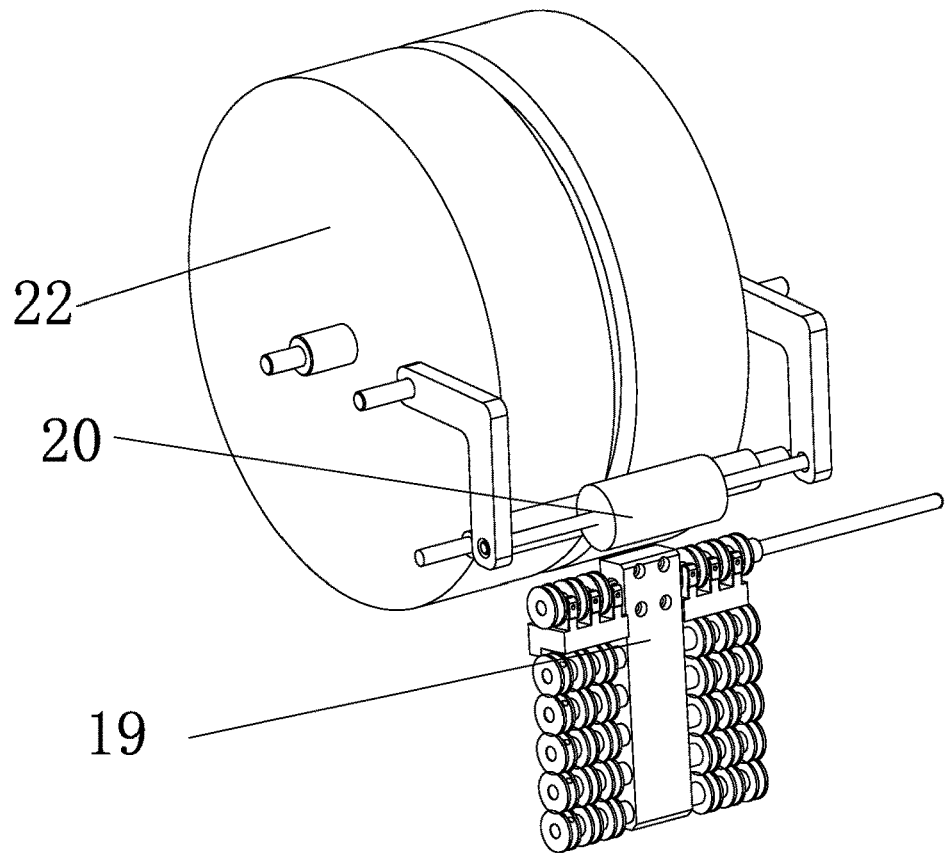
FIG. 11 is a schematic view showing a position relationship of the primary feeding mechanism, a secondary feeding mechanism and a wafer pressing mechanism according to an embodiment of the present disclosure.
Figure 12:
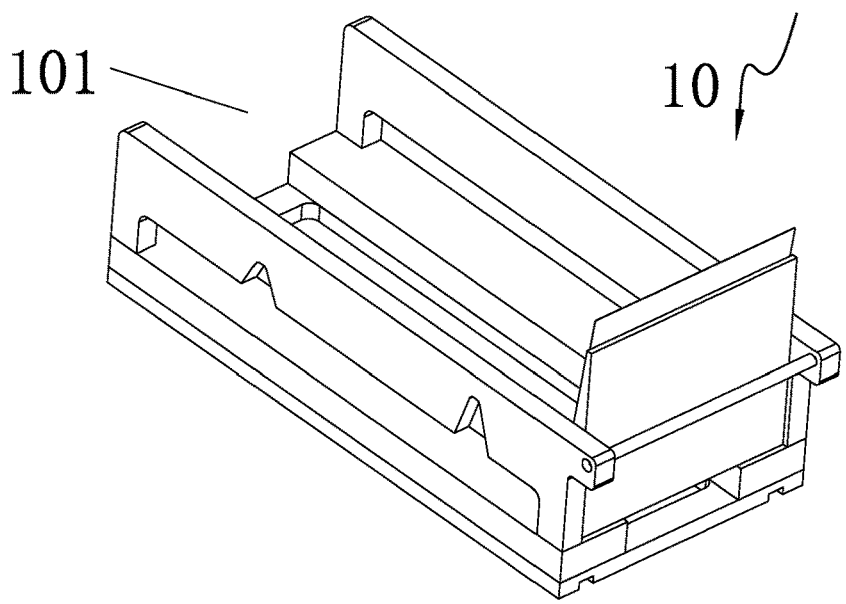
FIG. 12 is a schematic view of a silicon wafer clip according to an embodiment of the present disclosure.

| | |
|---|---|
| 1, carrying-transferring water tank; | 2, feeding manipulator; |
| 3, lifting fork; | 4, wafer inserting unit; |
| 5, handling assembly; | 6, turnover assembly; |
| 7, wafer basket arraying mechanism; | 8, drainage block; |
| 9, clip bracket; | 10, silicon wafer clip; |
| 11, guiding plate; | 12, positioning block; |
| 13, guiding wheel; | 14, main framework; |
| 15, parallel guiding rail; | 16, sliding table; |
| 17, rectangular fork; | 18, guiding assembly; |
| 181, supporting seat; | 182, guiding roller; |
| 19, primary feeding mechanism; | 191, water suction plate; |
| 192, rolling wheel; | 20, wafer pressing mechanism; |
| 21, side spray wafer-separation mechanism; | 211, side spray nozzle; |
| 212, mounting bottom plate; | 22, secondary feeding mechanism; |
| 23, in-place detection assembly; | 231, approaching sensor; |
| 232, fixing rod; | 233, fixing block; |
| 234, rotation arm; | 24, jacking wafer discharge machine; |
| 25, visual detector; | 26, abnormal wafer storage box; |
| 27, conveying shaft; | 28, buffer bar; |
| 29, swing rod; | 30, rotation cylinder; |
| 31, X-axis manipulator; | 32, Y-axis manipulator; |
| 33, Z-axis manipulator; | 34, full basket clamp; |
| 35, empty basket clamp; | 36, feeding sink; |
| 37, underwater conveying device; | 38, turnover back plate; |
| 39, turnover motor; | 40, turnover bottom plate. |
| 41, frame body; | 42, water tank body; |
| 43, driving motor | 44, centering machanism; |
| 45, wafer inserting assembly; | 46, vertical lifting device; |
| 47, wafer basket; | 48, sliding block; |
| 49, clamp; | 50, silicon wafer inlet; |
| 51, lever; | 101, silicon wafer outlet; |
| 193, mounting plate; | 194, water suction hole; |
| 195, water outlet; | 213, fixing plate; |
| 214, water inlet; | 241, wafer discharge machine bracket. |

DETAILED DESCRIPTION OF THE EMBODIMENTS

It should be noted that the embodiments of the present disclosure and features in the embodiments may be combined with each other without conflict.

In the description of the present disclosure, it should be noted that the orientation or positional relationship indicated by the terms, such as "central", "vertical", "horizontal", "upper", "lower", "front", "rear", "left", "right", "vertical", "horizontal", "top", "bottom", "inner", and "outer", are based on the orientation or positional relationship shown in the drawings, which are only to facilitate the description of the present application and to simplify the description, rather than indicating or implying that the device or element referred to must have a specific orientation, or can only be configured and operated in a particular orientation. Therefore, the above-mentioned terms should not be construed as a limitation to the present application. In addition, the terms "first", "second" and the like are for purpose of description, and should not be interpreted as indicating or implying relative importance or implying the number of the indicated technical features. Therefore, the features defined by "first" and "second" may explicitly or implicitly include one or more of the features. In the present application, the word "multiple" indicates two or more unless otherwise specified.

In the description of the present application, it should be noted that, otherwise clear specification and definition are provided, terms such as "mounting", "joint" and "connection" should be understood in a broad sense, such as a fixed connection, a detachable connection or an integral connection; a mechanical connection or an electrical connection; a direct connection or an indirect connection through an intermediate media, or an internal connection inside two components. For those skilled in the art, the specific meaning of the above terms in the present application may be understood in the light of specific circumstances.

The present disclosure is described in detail below with reference to the drawings and in conjunction with the embodiments.

As shown in FIG. 1, a vertical feeding and wafer inserting integrated machine includes a frame body and a silicon wafer conveying device which is arranged on the frame body;
one end of the frame body is provided with a carrying-transferring water tank 1 for carrying and transferring silicon wafers; the frame body is further provided with a feeding unit for conveying the silicon wafers in the carrying-transferring water tank 1 to a silicon wafer conveying belt; one end, away from the feeding unit, of the silicon wafer conveying device is provided with a wafer inserting unit 4 for inserting the silicon wafers into a wafer basket, and the other end of the wafer inserting unit 4 is provided with a wafer basket arraying mechanism 7; and
the frame body is correspondingly provided with a washing manipulator for taking grouped wafer baskets into washing procedure.

As shown in FIGS. 2 to 7, the carrying-transferring water tank 1 includes a water tank body, a silicon wafer clip 10, a centering bracket and a clip bracket 9;
the water tank body has a groove structure with an opening at a top and a first drainage block 8 and a second drainage block 8 on two sides, a groove is defined at a top of the first drainage block 8; the clip bracket 9 for placing the silicon wafer clip 10 is provided between the first drainage block 8 and the second drainage block 8; and the silicon wafer clip 10 is configured to carry the silicon wafer silicon wafers, and a lifting point of the manipulator for feeding is further provided on the silicon wafer clip 10.

Furthermore, the frame body is further provided with a lifting fork 3; the lifting fork 3 includes a main framework 14 and parallel guiding rails 15 vertically arranged on one side of the main framework 14; a sliding table 16 is corresponding provided on each parallel guiding rail 15, a rectangular fork 17 perpendicular to the parallel guiding rail 15 is provided on the sliding table 16; and a top of the main framework 14 is provided with a driving motor 43 for driving the sliding tables 16 to move;
a centering mechanism for abutting with the lifting fork 3 is provided on a bottom plate of the water tank body; the centering mechanism includes positioning blocks 12 and guiding plates 11; each guiding plate 11 is fixed at two ends of a bottom of the water tank body, each positioning block 12 is arranged between the two guiding plates 11; a side, facing outward, of the guiding plate 11 is provided with multiple guide wheels 13;
the middle of the positioning block 12 is provided with a circular positioning hole, which is used for positioning a device in a degumming machine; a thickness of the positioning blocks 12 is less than a thickness of the guiding plates 11; and
a centering base corresponding to the centering mechanism is provided on the rectangular fork 17.

The centering base includes a base body and multiple guiding assemblies 18 arranged on the base body; each guiding assembly 18 includes a fixing plate, a supporting seat 181 and a guiding roller 182; multiple screw holes are defined in the fixing plate, and the fixing plate is fixed to the base body; two sides of a top of the supporting seat 181 are provided with rotation shaft mounting plates, respectively; the guiding roller 182 is arranged between the two rotation shaft mounting plates and is rotatably connected with the rotation shaft mounting plates. A thickness of the guiding roller 182 corresponds to the thickness of the guiding plates 11.

A water tank positioning frame body is formed by welding angle steels, which can automatically find the center when the position of the incoming material is uncertain. The water tank body is formed by welding steel plates and is filled with water, so as to prevent the oxidation of the silicon wafers. An included angle of 5° is formed between the clip bracket 9 and a horizontal direction, which ensures that the silicon wafers are not scattered during the transportation. The silicon wafer clip 10 is configured to carry the silicon wafer into the feeding unit; and the manipulator lifting point for automatic feeding is provided in the silicon wafer clip 10.

The silicon wafer carrying-transferring water tank enters into an interior of the degumming machine, and the interior of the silicon wafer clip 10 is filled with the silicon wafers, the silicon wafer carrying-transferring water tank is transferred to a centering position on the second floor by the lifting fork 3, and then the carrying robot carries the load and is aligned with a clip feeding module. Due to the low transport accuracy of AGV, the clip cannot be normally fed. Regarding this, a water tank centering frame mechanism is developed, which can perform centering correction when the AGV travel error ranges from (left or right) ±20 mm. The clip bracket 9 enables an included angle of 5° formed between the clip and the horizontal plane, which is beneficial to preventing the silicon wafers from turning over during the transportation of the water tank. After the silicon wafer carrying-transferring water tank uploads to the clip feeding machine, the manipulator is hooked to the lifting point on the silicon wafer clip 10 for feeding.

As shown in FIGS. 8 to 12, the feeding unit includes a primary feeding mechanism 19, and a secondary feeding mechanism 22; the primary feeding mechanism 19 is arranged below a water surface and is adjacent to a silicon wafer outlet of the silicon wafer clip 10; the primary feeding mechanism 19 is vertically arranged and is located in a tangential direction of a wheel-shaped structure, an upper end of the primary feeding mechanism 19 is adjacent to the secondary feeding mechanism 22; the primary feeding mechanism 19 is configured to hold the silicon wafers in the silicon wafer clip 10 and upload the silicon wafers to the secondary feeding mechanism 22; the secondary feeding mechanism has a wheel-shaped structure and is in transmission connection with the frame body, an upper portion of the secondary feeding mechanism is located above the water surface; and the secondary feeding mechanism 22 is configured to turn over the silicon wafers from a vertical state to a horizontal state for entering the silicon wafer conveying device.

The primary feeding mechanism 19 includes a mounting plate and a water suction plate 191;
the mounting plate has a rectangular structure, which is vertically arranged and is fixedly connected to the frame body; and the water suction plate 191 is fixed to a side of an upper portion of the rectangular structure close to the end;

an accommodating space is defined in an interior of the water suction plate 191, and multiple water suction holes are defined in a side, close to the silicon wafers, of an exterior of the water suction plate; a water outlet is provided on a side, away from the mounting plate, of the water suction plate 191 and is in communication with a water suction pump through a pipeline; and the water suction holes and the water outlet are in communication with the accommodating space in the interior of the water suction plate 191;

multiple mounting holes are further provided in surfaces, which are used to fix the water suction plate 191, of the mounting plate, a rotation shaft is corresponding provided in each mounting hole; the rotation shaft is rotatably connected with the corresponding mounting hole, and two ends of the rotation shaft are rotatably connected with the frame body; each rotation shaft is fixedly provided with multiple rolling wheels 192, the rolling wheels 192 are fixedly connected to the corresponding rotation shaft; and ends of one or more rotation shafts are correspondingly provided with a driving motor for driving the rotation shafts to rotate.

A wafer pressing mechanism 20 is provided in a plane along a radial direction of the wheel-shaped structure of the secondary feeding mechanism 22 and perpendicular to the primary feeding mechanism 19; and a gap is reserved between the wafer pressing mechanism 20 and the secondary feeding mechanism 22;

the wafer pressing mechanism 20 has a cylindrical structure with a rotation shaft hole at an axis thereof, and a mounting shaft is correspondingly provided in the rotation shaft hole;

the wafer pressing mechanism 20 includes a L-shaped connector, which is fixed to the mounting shaft; two ends of the L-shaped connector are respectively provided with a mounting hole; one end of the L-shaped connector is rotatably connected to the mounting shaft, and the other end of the L-shaped connector is fixedly connected to the frame body through the rotation shaft hole.

A side spray wafer-separation mechanism 21, which is used for blowing the stacked silicon wafers to be arranged at intervals, is further provided between the silicon wafer clip 10 and the primary feeding mechanism 19; and the side spray wafer-separation mechanism 21 includes a mounting bottom plate 212 and multiple side spray nozzles 211;

a main body of the mounting bottom plate 212 is rounded rectangular, an upper side and a lower side of the middle are extended outward to form fixing plates, and each fixing plate is provided with a screw hole for fixation;

an interior of the mounting bottom plate 212 is hollow, a side, close to the water tank, of the mounting bottom plate 212 is provided with multiple mounting holes for mounting the side spray nozzles 212, the mounting holes are extended through to an internal space of the mounting bottom plate 212; a side of the mounting bottom plate is provided with a water inlet which is extended through to the internal space; and the water inlet is configured to connect an external water inlet pipeline with a water pump.

The frame body is further provided with a manipulator for pushing out the silicon wafers in the silicon wafer clip 10.

The silicon wafer clip 10 carries the silicon wafers to the feeding unit, the silicon wafer clip 10 is step advanced under the action of the manipulator; the side spray wafer-separation mechanism 21 blows the stacked silicon wafers to be arranged at intervals, the water suction plate 191 sucks the silicon wafers, and thus the primary feeding mechanism 19 performs the feeding action. The primary feeding method is in an interval feeding. The silicon wafers are abutted with the secondary feeding mechanism 22, and adhered with the tension of water, turned over from a vertical state into a horizontal state, and then are fed in the silicon wafer conveying device.

Figure 13:
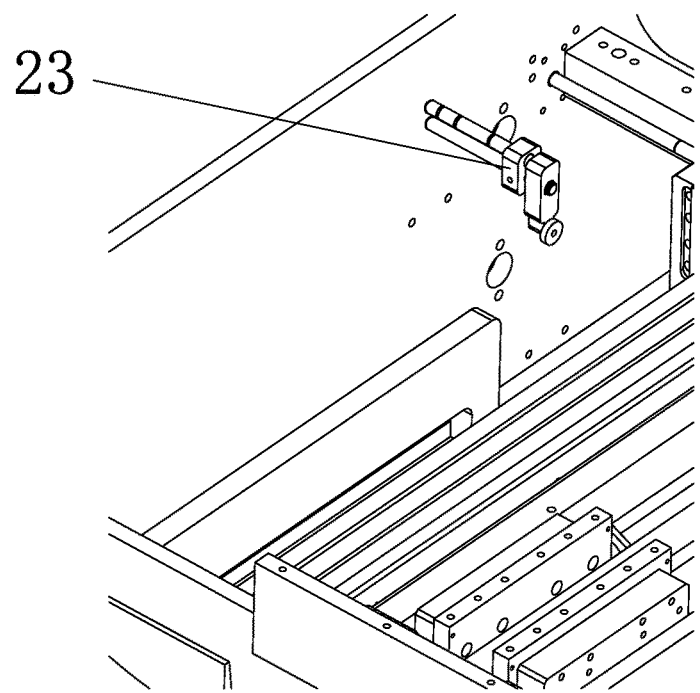
FIG. 13 is a schematic view showing a mounting position of an in-place detection assembly according to an embodiment of the present disclosure.
Figure 14:
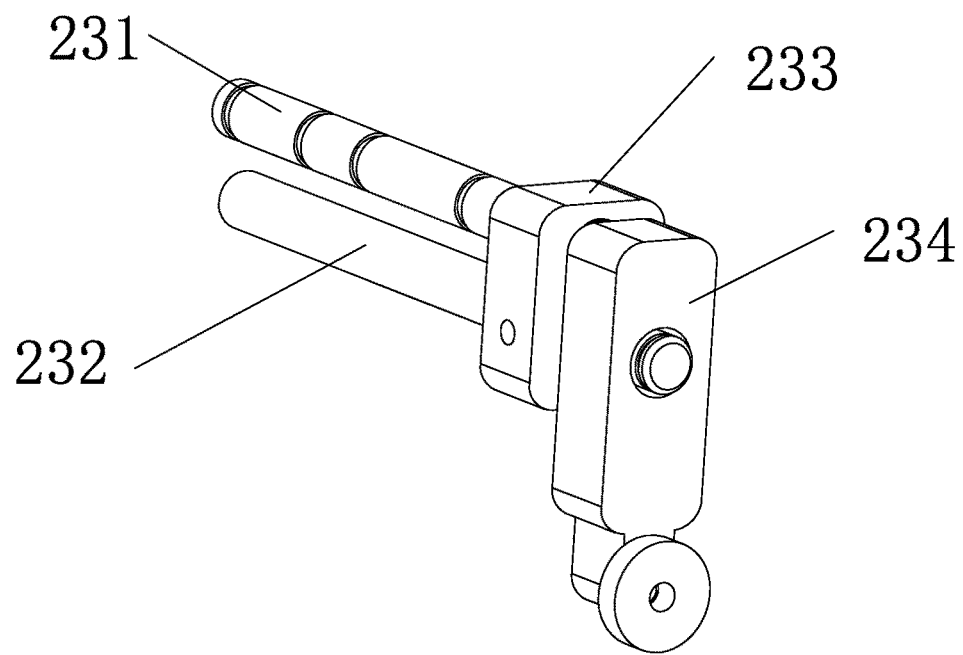
FIG. 14 is a schematic view of the in-place detection assembly according to an embodiment of the present disclosure.
Figure 16:
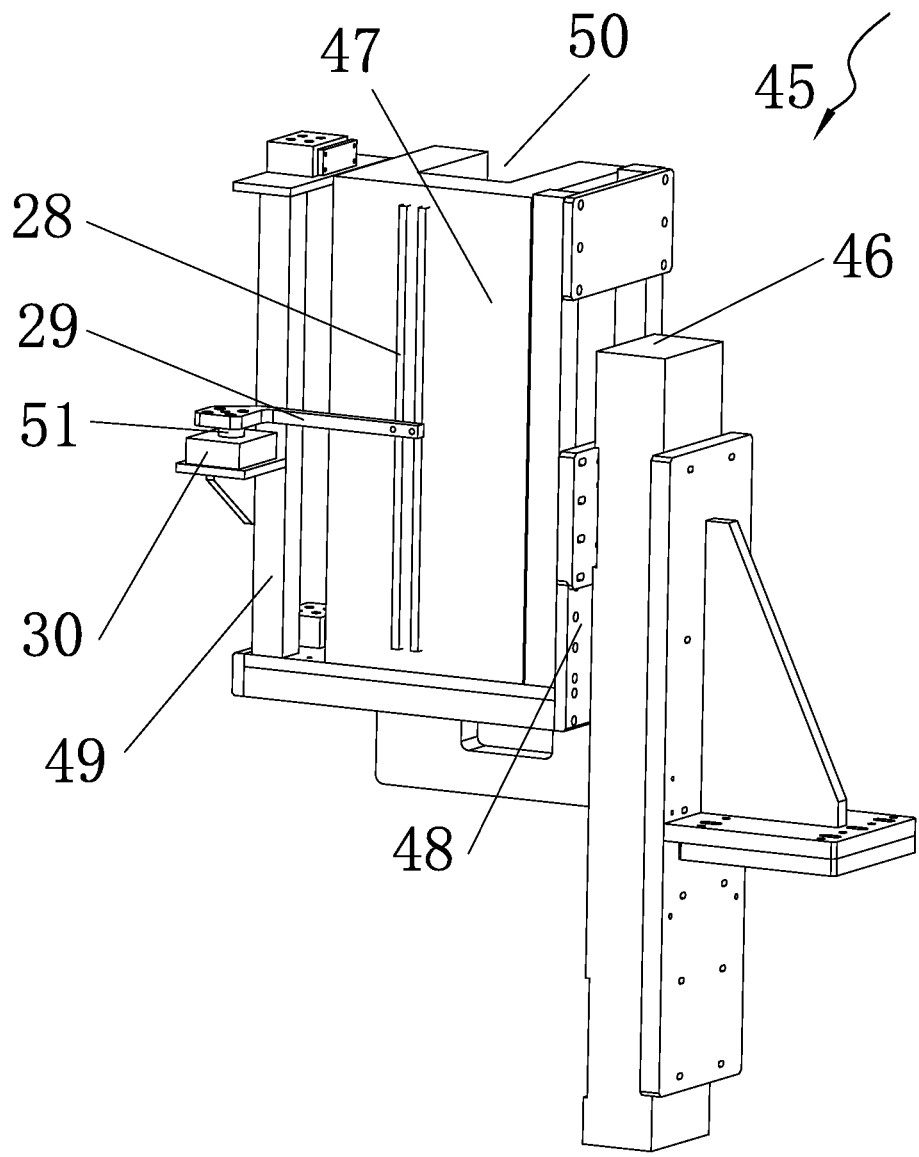
FIG. 16 is a schematic view of a wafer inserting assembly according to an embodiment of the present disclosure.
Figure 17:
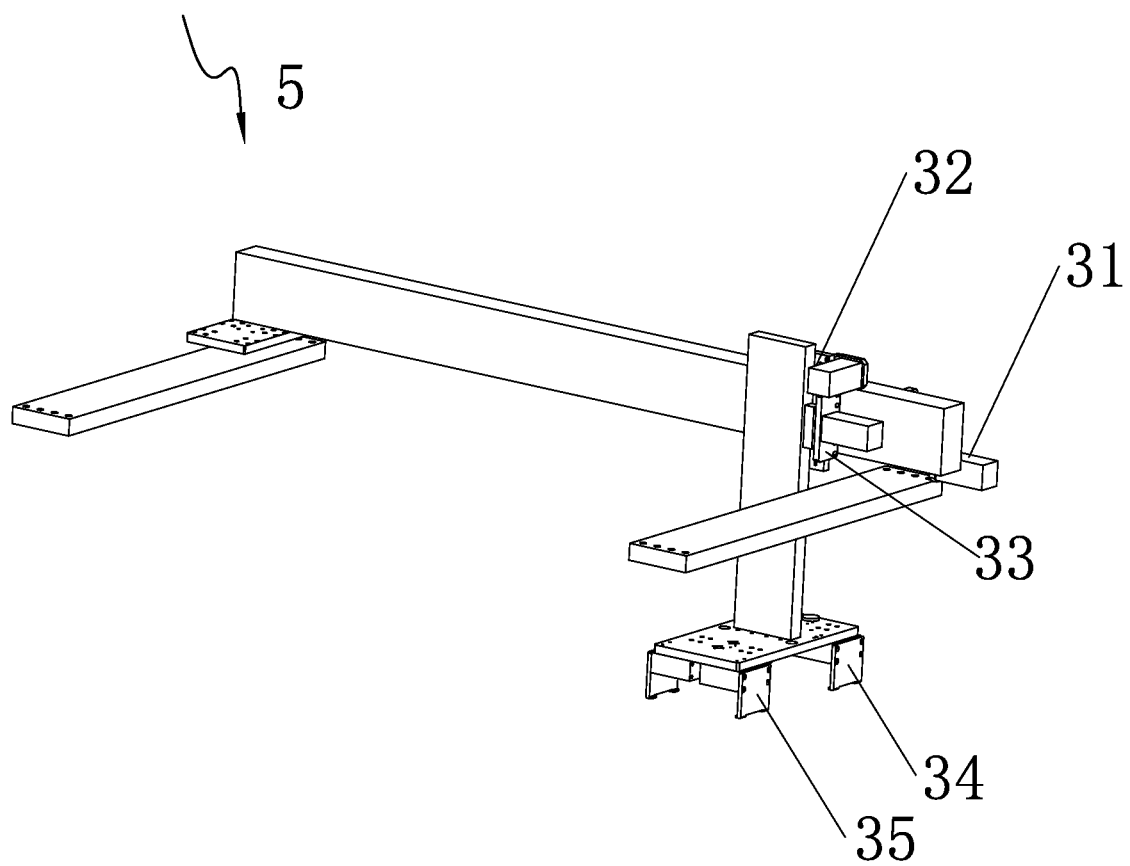
FIG. 17 is a schematic view of a handling assembly according to an embodiment of the present disclosure.

As shown in FIG. 13 and FIG. 14, the feeding unit includes an in-place detection assembly 23; the in-place detection assembly 23 includes an approaching sensor 231, a rotation arm 234, a mounting rod and a mounting block, one end of the mounting rod penetrates through a lower portion of the mounting block, the other end of the mounting rod is mounted on the frame body, the end, close to the mounting block, of the mounting rod is rotatably connected to the rotation arm 234, and the approaching sensor 231 is fixed on the mounting block and is arranged toward a direction of the rotation arm 234. The in-place detection assembly 23 includes a control unit, and the approaching sensor 231 is connected to the control unit;

the wafer inserting unit 4 includes a wafer inserting assembly and a handling assembly 5;

the wafer inserting assembly includes a vertical lifting device and a wafer basket; a sliding block of the vertical lifting device is provided with a clamp corresponding to the wafer basket, and the wafer basket is detachably connected to the clamp; multiple wafer-placing grooves are provided inside the wafer basket; a silicon wafer inlet is provided in one side of the wafer basket, and another side, away from the silicon wafer inlet, of the wafer basket is provided with a buffer mechanism;

as shown in FIG. 16, the buffer mechanism includes a rotation cylinder 30, a buffer bar 28 and a swing rod 29, a lever of the rotation cylinder 30 is connected to the swing rod 29, the buffer bar 28 is mounted on the swing rod 29, and the buffer bar 28 is placed in the wafer basket by the rotation of the rotation cylinder 30;

as shown in FIG. 17, the handling assembly 5 includes a triaxial manipulator and a clamp; the triaxial manipulator is mounted on the frame body and is located above the silicon wafer conveying belt; the clamp is configured to clamp the wafer basket and is fixedly connected to the triaxial manipulator; the handling assembly 5 is configured to handle and transfer the wafer basket. The triaxial manipulator is provided with an X-axis manipulator 31, a Y-axis manipulator 32 and a Z-axis manipulator 33; the clamp includes a full basket clamp 34 and an empty basket clamp 35;

a vertical lifting module includes a sliding block and a sliding rail, one end of the sliding block is fixed on an outer wall of a first positioning side plate, and the other end of the sliding block is mounted on the sliding rail.

Figure 15:
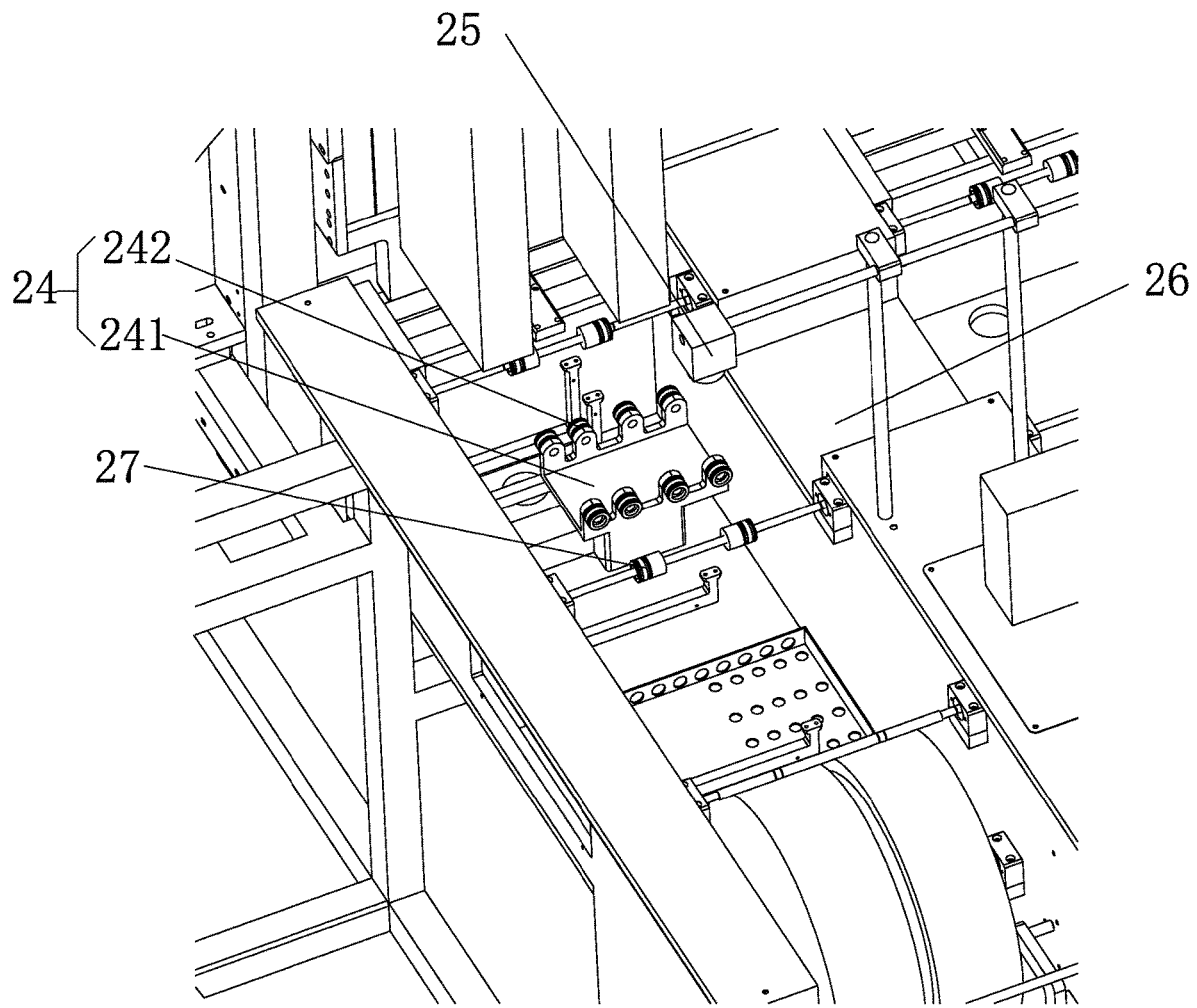
FIG. 15 is a schematic view of a waste discharge assembly according to an embodiment of the present disclosure.

As shown in FIG. 15, a waste discharge assembly is provided in the silicon wafer conveying belt; the waste discharge assembly includes a jacking wafer discharge machine 24 and a visual detector 25;

the visual detector 25 is configured to detect the silicon wafers on the conveying belt;

the silicon wafer conveying device includes multiple conveying shafts 27 which are rotatably connected to the frame body, and the frame body is correspondingly provided with a driving motor for driving the conveying shafts 27 to move and a conveying belt;

the jacking wafer discharge machine 24 is mounted under the silicon wafer conveying device and between two conveying shafts 27; the jacking wafer discharge machine 24 includes a wafer discharge machine bracket; a cylinder for driving the jacking wafer discharge machine to move upward is provided at a bottom of the wafer discharge machine bracket, multiple conveying wheels are provided at a top of the wafer discharge machine bracket; and the conveying wheels are correspondingly provided with a driving device for driving the conveying wheels to move;

a conveying direction of the conveying wheels is perpendicular to a conveying direction of the silicon wafer conveying device; an abnormal wafer storage box 26 is provided outside the silicon wafer conveying device and along the conveying direction of the conveying wheels.

Figure 18:
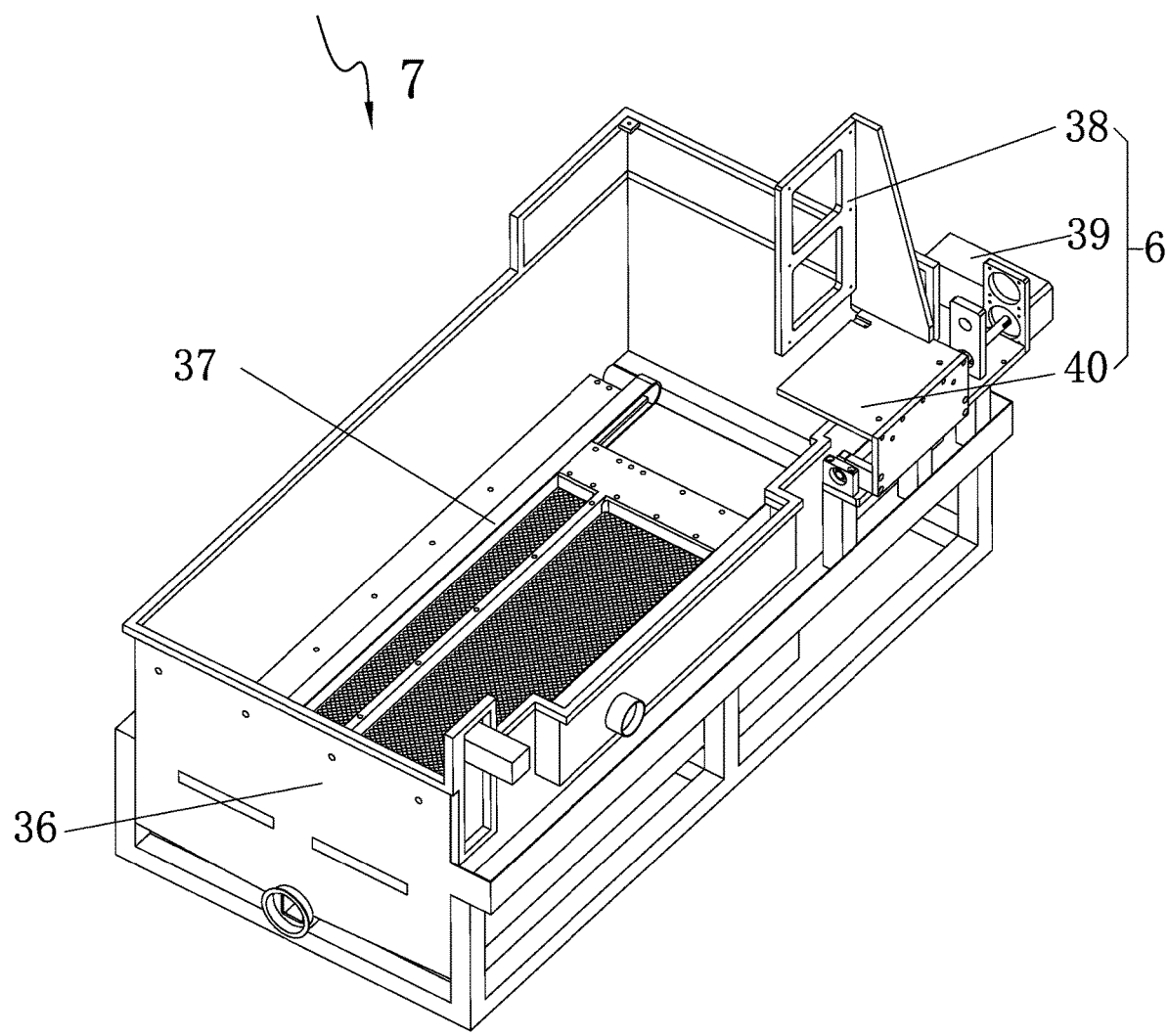
FIG. 18 is a schematic view of a wafer basket arraying mechanism according to an embodiment of the present disclosure.

As shown in FIG. 18, the wafer basket arraying mechanism 7 includes a feeding tank 36, an underwater conveying device 37 and a basket turnover assembly 6;

the feeding sink 36 is mounted on the frame body, the underwater conveying device 37 is mounted at an internal bottom of the feeding sink 36; and the basket turnover assembly 6 turnovers the full wafer basket to be on the underwater conveying device 7 so as to convey the full wafer basket to a next procedure;

the basket turnover assembly 6 includes a turnover back plate 38, a turnover motor 39 and a turnover bottom plate 40, the turnover back plate 38 is fixed on the turnover bottom plate 40, and the turnover motor 39 penetrates through the frame body and is fixedly connected to the turnover bottom plate 40.

The carrying robot carries the silicon wafer carrying-transferring water tank to a connection position of the clip feeding machine, the vertical lifting forklift separates the water tank from the carrying robot, the carrying robot is driven away from the connection position, and the feeding of the water tank is completed. The double-clip feeding manipulator 2 takes the empty clip out from the wafer inserting machine and places it into the empty water tank, and another manipulator grabs a full clip for feeding. The wafer inserting machine adopts the vertical wafer inserting method, which can effectively reduce the wafer breaking rate. The clip is step advanced under the action of the propelling manipulator; and the silicon wafer in-place detection is performed by the in-place detection assembly 23. After the silicon wafers are in place, the side spray wafer-separation mechanism blows the stacked silicon wafers to be arranged at intervals, the water suction plate 191 of the primary feeding mechanism 19 holds the silicon wafers, and the primary feeding mechanism 19 performs the feeding action. The primary feeding method is in an interval feeding. The silicon wafers are abutted with the secondary feeding mechanism 22, adhered by the tension of water, turned over from a vertical state into a horizontal state, and then are fed in the silicon wafer conveying device in order to be inserted into the wafer basket. A camera recognizes the integrity of the silicon wafer. When there is unqualified silicon wafer, the unqualified silicon wafer is discharged into a waste basket through the waste discharge assembly. The full wafer basket in the station is taken out by the handling assembly 5, and then the empty wafer basket is uploaded; the handling assembly 5 is a double-ended manipulator, which can effectively save the reciprocating time of the manipulator. The full wafer basket is put into the basket turnover assembly 6, the wafer basket is changed from a vertical position to a horizontal position, the horizontal wafer basket is directly uploaded to a wafer basket transferring line, the wafer baskets are arranged in groups, the washing manipulator transfers the grouped wafer baskets for washing procedure when the set number of wafer baskets reached.

The above is only a preferred embodiment of the present application, and is not intended to limit the present application. Any modifications, equivalent substitutions, improvements made within the spirit and principles of the present application should be included in the scope of protection of the present application.

The invention claimed is:

1. A vertical feeding and wafer inserting integrated machine, comprising a frame body and a silicon wafer conveying device which is arranged on the frame body;

one end of the frame body is provided with a carrying-transferring water tank for carrying and transferring silicon wafers; the frame body is further provided with a feeding unit for conveying the silicon wafers in the carrying-transferring water tank; one end, away from the feeding unit, of the silicon wafer conveying device is provided with a wafer inserting unit for inserting the silicon wafers into a wafer basket, and one end of the wafer inserting unit is provided with a wafer basket arraying mechanism; and wherein the carrying-transferring water tank comprises a water tank body, a silicon wafer clip and a clip bracket; the water tank body is opened at a top thereof, and drainage blocks are provided on two sides of the water tank body for draining water into the groove body; the clip bracket for placing the silicon wafer clip is provided between the two drainage blocks; and the silicon wafer clip is configured to carry the silicon wafers.

2. The vertical feeding and wafer inserting integrated machine according to claim 1, wherein the frame body is further provided with a lifting fork for conveying the carrying-transferring water tank to the feeding unit; the lifting fork comprises a main framework and parallel guiding rails vertically arranged on one side of the main framework; wherein a sliding table is corresponding provided on each parallel guiding rail, a rectangular fork perpendicular to the parallel guiding rail is provided on the sliding table; and a top of the main framework is provided with a driving motor for driving the sliding tables to move;

a centering mechanism for aligning with the lifting fork is provided in a bottom plate of the water tank body; the centering mechanism comprises positioning blocks and guiding plates; each guiding plate is fixed at two ends of a bottom of the water tank body, each positioning block is arranged between the two guiding plates; a side, facing outward, of the guiding plate is provided with a plurality of guide wheels; and the middle of the positioning block is provided with a circular positioning hole for positioning.

3. The vertical feeding and wafer inserting integrated machine according to claim 1, wherein the feeding unit further comprises an in-place detection assembly; the in-place detection assembly comprises an approaching sensor, a rotation arm, a mounting rod and a mounting block, one end of the mounting rod penetrates through a lower portion of the mounting block, the other end of the mounting rod is mounted on the frame body, the end, close to the mounting block, of the mounting rod is rotatably connected to the rotation arm, and the approaching sensor is fixed on the mounting block and is arranged toward a direction of the rotation arm.

4. The vertical feeding and wafer inserting integrated machine according to claim 1, wherein the wafer inserting unit comprises a wafer inserting assembly and a handling assembly;

the wafer inserting unit comprises a vertical lifting device and a wafer basket; a sliding block of the vertical lifting device is provided with a clamp corresponding to the wafer basket, and the wafer basket is detachably connected to the clamp; a silicon wafer inlet is provided in one side of the wafer basket, and another side, away from the silicon wafer inlet, of the wafer basket is provided with a buffer mechanism;

the buffer mechanism comprises a rotation cylinder, a buffer bar and a swing rod, a lever of the rotation cylinder is connected to the swing rod, the buffer bar is mounted on the swing rod, and the buffer bar is placed in the wafer basket by the rotation of the rotation cylinder;

the handling assembly comprises a triaxial manipulator and a clamp; the triaxial manipulator is mounted on the frame body; the clamp is configured to clamp the wafer basket and is fixedly connected to the triaxial manipulator; the handling assembly is configured to handle and transfer the wafer basket.

5. The vertical feeding and wafer inserting integrated machine according to claim 1, wherein a waste discharge assembly is provided; the waste discharge assembly comprises a jacking wafer discharge machine and a camera;

the camera is configured to detect the silicon wafers;

the silicon wafer conveying device includes a plurality of conveying shafts which are rotatably connected to the frame body;

the jacking wafer discharge machine is mounted under the silicon wafer conveying device and between two conveying shafts; the jacking wafer discharge machine comprises a wafer discharge machine bracket; a top of the wafer discharge machine bracket is provided with a plurality of conveying wheels;

a conveying direction of the conveying wheels is perpendicular to a conveying direction of the silicon wafer conveying device; an abnormal wafer storage box is provided outside the silicon wafer conveying device and along the conveying direction of the conveying wheels.

6. The vertical feeding and wafer inserting integrated machine according to claim 1, wherein the wafer basket arraying mechanism comprises a feeding sink, an underwater conveying device and a basket turnover assembly;

the feeding sink is mounted in the frame body, the underwater conveying device is mounted at an internal bottom of the feeding sink; the basket turnover assembly turns over the full wafer basket to be on the underwater conveying device so as to convey the full wafer basket to the next procedure;

the basket turnover assembly comprises a turnover back plate, a turnover motor and a turnover bottom plate, the turnover back plate is fixed on the turnover bottom plate, and the turnover motor is fixedly connected to the turnover bottom plate.

7. A vertical feeding and wafer inserting integrated machine, comprising a frame body and a silicon wafer conveying device which is arranged on the frame body;

one end of the frame body is provided with a carrying-transferring water tank for carrying and transferring silicon wafers; the frame body is further provided with a feeding unit for conveying the silicon wafers in the carrying-transferring water tank; one end, away from the feeding unit, of the silicon wafer conveying device is provided with a wafer inserting unit for inserting the silicon wafers into a wafer basket, and one end of the wafer inserting unit is provided with a wafer basket arraying mechanism; and wherein the feeding unit comprises a primary feeding mechanism and a secondary feeding mechanism; the primary feeding mechanism is arranged below a water surface and is adjacent to a silicon wafer outlet of the silicon wafer clip; wherein the primary feeding mechanism is vertically arranged, an upper end of the primary feeding mechanism is adjacent to the secondary feeding mechanism; the primary feeding mechanism is configured to hold the silicon wafers in the silicon wafer clip and convey the silicon wafers to the secondary feeding mechanism; the secondary feeding mechanism has a wheel-shaped structure and is in transmission connection with the frame body, an upper portion of the secondary feeding mechanism is located above the water surface; and the secondary feeding mechanism is configured to turn over the silicon wafers from a vertical state to a horizontal state for feeding the silicon wafers in the silicon wafer conveying device;

a wafer pressing mechanism is provided on a plane along a radial direction of the wheel-shaped structure of the secondary feeding mechanism and perpendicular to the primary feeding mechanism; and a gap is provided between the wafer pressing mechanism and the secondary feeding mechanism;

the wafer pressing mechanism has a cylindrical structure with a rotation shaft hole at an axis, and a mounting shaft is correspondingly provided in the rotation shaft hole and rotatably connected to the frame body, wherein the primary feeding mechanism comprises a mounting plate and a water suction plate;

the mounting plate has a rectangular structure, which is vertically arranged and fixedly connected to the frame body; and the water suction plate is fixed to a side, close to an end, of an upper portion of the rectangular structure;

an accommodating space is provided in an interior of the water suction plate, and a plurality of water suction holes are provided on a side, close to the silicon wafers, of an exterior of the water suction plate; a water outlet is provided on a side, away from the mounting plate, of the water suction plate; and the water suction holes and the water outlet are in communication with the accommodating space in the interior of the water suction plate;

a surface, fixed to the water suction plate, of the mounting plate is further provided with a plurality of mounting holes, a rotation shaft is corresponding provided in each mounting hole;

the rotation shaft is rotatably connected with the corresponding mounting hole, and two ends of the rotation shaft are rotatably connected with the frame body; a plurality of rolling wheels are fixedly provided in each rotation shaft, the rolling wheels are fixedly connected to the corresponding rotation shaft.

8. The vertical feeding and wafer inserting integrated machine according to claim 7, wherein a side spray wafer-separation mechanism for blowing the stacked silicon wafers to be arranged at intervals is further provided between the silicon wafer clip and the primary feeding mechanism; and the side spray wafer-separation mechanism comprises a mounting bottom plate and a plurality of side spray nozzles;

a main body of the mounting bottom plate is rounded rectangular, an upper side and a lower side of the middle are extended outward to form fixing plates, and each fixing plate is provided with a screw hole for fixation;

an interior of the mounting bottom plate is hollow, a side, close to the water tank, of the mounting bottom plate is provided with a plurality of mounting holes for mounting the side spray nozzles, the mounting holes are extended through to an internal space of the mounting bottom plate; a side of the mounting bottom plate is provided with a water inlet which extends through to the internal space.

\* \* \* \* \*